United States Patent
Machida et al.

(12)

(10) Patent No.: US 6,605,324 B1
(45) Date of Patent: Aug. 12, 2003

(54) LIQUID CRYSTAL RESIN LAMINATED FILM, METHOD FOR MANUFACTURING THE SAME, AND CIRCUIT BOARD COMPRISING LIQUID CRYSTAL RESIN LAMINATED FILM

(75) Inventors: Tetsuya Machida, Otsu (JP); Kenji Tsunashima, Kyoto (JP); Jun Sakamoto, Otsu (JP)

(73) Assignee: Toray Industries, Inc. (JP)

( * ) Notice: Subject to any disclaimer, the term of this patent is extended or adjusted under 35 U.S.C. 154(b) by 0 days.

(21) Appl. No.: 09/857,227

(22) PCT Filed: Sep. 28, 2000

(86) PCT No.: PCT/JP00/06702

§ 371 (c)(1),
(2), (4) Date: Jun. 1, 2001

(87) PCT Pub. No.: WO01/25007

PCT Pub. Date: Apr. 12, 2001

(30) Foreign Application Priority Data

Oct. 7, 1999 (JP) ............................................ 11-286544

(51) Int. Cl.[7] ............................. C09K 19/00; B32B 3/00
(52) U.S. Cl. ........................ 428/1.6; 428/209; 428/901; 174/258; 264/466; 264/467
(58) Field of Search .............................. 428/1, 209, 1.6, 428/901; 174/258; 264/466, 467

(56) References Cited

U.S. PATENT DOCUMENTS

| | | | | |
|---|---|---|---|---|
| 5,248,530 A | * | 9/1993 | Jester et al. ................... 428/1 |
| 5,364,669 A | * | 11/1994 | Sumida et al. ................. 428/1 |
| 5,589,236 A | * | 12/1996 | Harvey et al. ................. 428/1 |
| 5,972,439 A | * | 10/1999 | Tsunashima et al. ........... 428/1 |
| 5,997,765 A | * | 12/1999 | Furuta et al. .......... 252/299.01 |

FOREIGN PATENT DOCUMENTS

| | | | |
|---|---|---|---|
| EP | 737707 | * | 10/1996 |
| EP | 911150 | * | 4/1999 |
| JP | 04-135750 | * | 5/1992 |
| JP | 11-060756 | * | 3/1999 |

* cited by examiner

*Primary Examiner*—Cathy Lam
(74) *Attorney, Agent, or Firm*—Piper Rudnick LLP

(57) ABSTRACT

Disclosed are a liquid-crystalline resin laminated film comprising a liquid-crystalline resin layer and a non-liquid-crystalline thermoplastic resin layer laminated on at least one surface of the liquid-crystalline resin layer, and having an interlayer adhesiveness of at least 30 N/cm; and a liquid-crystalline resin laminated film comprising a liquid-crystalline resin layer and a non-liquid-crystalline thermoplastic resin layer laminated on at least one surface of the liquid-crystalline resin layer, and satisfying $T_N \geq T_L$ wherein $T_N$ and $T_L$ indicate the thermal deformation temperature of the non-liquid-crystalline thermoplastic resin layer and that of the liquid-crystalline resin layer, respectively, measured through thermal mechanical analysis (TMA). These are obtained by forming a non-liquid-crystalline thermoplastic resin layer on at least one surface of a liquid-crystalline resin layer through co-extrusion, followed by stretching the resulting laminated film.

15 Claims, No Drawings

LIQUID CRYSTAL RESIN LAMINATED FILM, METHOD FOR MANUFACTURING THE SAME, AND CIRCUIT BOARD COMPRISING LIQUID CRYSTAL RESIN LAMINATED FILM

TECHNICAL FIELD

The present invention relates to a liquid-crystalline resin laminated film having the advantages of good surface smoothness, good adhesiveness and low anisotropy in characteristics, to a method for producing it, and to a circuit board of the liquid-crystalline resin laminated film.

BACKGROUND ART

Liquid-crystalline resin has high strength and good heat resistance; its linear expansion coefficient is low; its insulating properties and gas-barrier properties are good; and its moisture absorption is low. Various injection moldings and fibers of the resin have heretofore been put to practical use. Printed wiring boards of the resin for IC are being developed.

While in melt, molecules of liquid-crystalline resin are oriented as they flow. Therefore, when the resin is extruded in an ordinary manner, it is greatly oriented in the flow direction and gives films of strong anisotropy. In addition, it does not uniformly flow in the transverse direction while extruded, and its films therefore have continuous streaks of uneven flow in the machine direction and their thickness variation is significant.

To solve the problem of anisotropy of the resin films in the flow direction, inflation methods are proposed in Japanese Patent Publication No. 39533/1994 and Japanese Patent Laid-Open No. 286626/1992. The liquid-crystalline resin films obtained according to the methods may be basically free from the problem of unbalanced physical properties in the MD/TD directions, but are still problematic in point of their surface roughness intrinsic to liquid-crystalline resin (including poor surface smoothness, poor abrasion resistance, and thickness variation). On the other hand, Japanese Patent Laid-Open Nos. 251438/1995 and 323506/1995 propose a method of laminating a liquid-crystalline resin and a heat-resistant resin through flat die extrusion, followed by biaxially stretching the resulting laminated film; and Japanese Patent Laid-Open No. 76397/1997 proposes a method of laminating a thermoplastic resin film of good adhesiveness on the surface of a liquid-crystalline resin film. The liquid-crystalline resin films obtained according to these methods could solve the problem of unbalanced physical properties in the MD/TD directions. However, in them, the interlayer adhesiveness between the liquid-crystalline resin layer and the non-liquid-crystalline resin layer is small, not enough to prevent interlayer peeling between them, and the quality of the films is still poor.

As so mentioned above, films produced through inflation are not good since their thickness is not even and, in addition, their surface smoothness and abrasion resistance are poor and they do not solve the problem intrinsic to liquid-crystalline resin. On the other hand, when a liquid-crystalline resin and a heat-resistant resin are laminated through flat die extrusion and the resulting laminated film is biaxially stretched, the anisotropy of the liquid-crystalline resin layer and the adhesiveness insufficiency of the film surface could be solved, but interlayer peeling between the liquid-crystalline resin layer and the heat-resistant resin layer is still inevitable and the film quality is therefore poor.

In addition, liquid-crystal line resin is poorly adhesive to other materials, and therefore requires chemical treatment and plasma treatment.

DISCLOSURE OF THE INVENTION

The present invention is to solve the problems in the related art mentioned above, and to provide a liquid-crystalline resin laminated film having the advantages of good interlayer adhesiveness of its liquid-crystalline resin layer to heat-resistant resin laminated thereon, good surface smoothness, good surface adhesiveness, and low anisotropy in characteristics, a method for producing it, and a circuit board of the liquid-crystalline resin laminated film.

The liquid-crystalline resin laminated film of the invention that attains the object is (a) a film comprising a liquid-crystalline resin layer and a non-liquid-crystalline thermoplastic resin layer laminated on at least one surface of the liquid-crystalline resin layer, which is characterized in that its interlayer adhesiveness is at least 30 N/cm; or (b) a film comprising a liquid-crystalline resin layer and a non-liquid-crystalline thermoplastic resin layer laminated on at least one surface of the liquid-crystalline resin layer, which is characterized in that it satisfies $T_N \geq T_L$ wherein $T_N$ and $T_L$ indicate the thermal deformation temperature of the non-liquid-crystalline thermoplastic resin layer and that of the liquid-crystalline resin layer, respectively, measured through thermal mechanical analysis (TMA).

The method for producing the liquid-crystalline resin laminated film of the invention that attains the object is characterized in that it comprises forming a non-liquid-crystalline thermoplastic resin layer on at least one surface of a liquid-crystalline resin layer through co-extrusion, followed by stretching the resulting laminated film.

The circuit board of the liquid-crystalline resin laminated film of the invention that attains the object is characterized in that it comprises a conductor pattern formed on at least one surface of the liquid-crystalline resin laminated film.

BEST MODES OF CARRYING OUT THE INVENTION

In the invention, the liquid-crystalline resin is a resin having a crystalline regular structure even in melt, including, for example, thermotropic liquid-crystal resins, and it may be any and every known one.

For example, for liquid-crystalline polyester resins, preferred is a liquid-crystalline polyester comprising from 40 to 90% by weight of an essential mesogen, parahydroxybenzoic acid (HBA) component and containing 4,4'-dihydroxybiphenyl (DHB) for improving the fluidity of the polyester. In this, the mesogen may be bonded to the polymer chain in any mode of random copolymerization, block copolymerization, branch copolymerization, or their combination of composite copolymerization. In the invention, preferred are liquid-crystalline resins comprising polyethylene terephthalate (PET) or polyethylene naphthalate (PEN)/HBA/DHB/terephthalic acid (TPA), etc.; copolymers comprising, as the essential ingredient, HBA/6-hydroxy-2-naphthoic acid; copolymers of HBA/4,4'-dihydroxybiphenyl with terephthalic acid and/or isophthalic acid; copolymers of 6-hydroxy-2-naphthoic acid with para-aminophenol; and copolymers of HBA/hydroquinone (HQ)/sebacic acid (SA). The liquid-crystalline polyester resins comprising the components as above have a regular structure even in melt, and their molecules are readily oriented in the flow direction, as flowing in melt.

In place of using the liquid-crystalline resin alone, also usable are polymer alloys containing any of the above-mentioned liquid-crystalline resins. For the alloying polymer to be mixed with or chemically bonded to the liquid-crystalline resins, usable are thermoplastic resins such as polyesters, polyamides, polyimides, polyamidimides, polyether-imides, polyarylates, polyphenylene sulfides, polyether-ether ketones, polyether sulfones, polysulfones, etc. However, these are not limitative. The blend ratio of the liquid-crystalline resin and the alloying polymer preferably falls between 10:90 and 90:10, more preferably between 20:80 and 80:20 by weight. Polymer alloys containing liquid-crystalline resin have good properties intrinsic to the liquid-crystalline resin therein.

For the laminated film of the invention, the non-liquid-crystalline thermoplastic resins to satisfy $T_N \geq T_L$, in which $T_N$ and $T_L$ indicate the thermal deformation temperature of the non-liquid-crystalline thermoplastic resin layer and that of the liquid-crystalline resin layer, respectively, measured through thermal mechanical analysis (TMA), are preferably polyamides, polyimides, polyamidimides, polyether-imides, polyarylates, polyphenylene sulfides, polyether-etherketones, polyether sulfones, polysulfones, and their copolymers and blends. The non-liquid-crystalline thermoplastic resins to satisfy $T_{N1} \geq T_{L1}$ after heat treatment of the laminated film, in which $T_{N1}$ and $T_{L1}$ indicate the thermal deformation temperature of the non-liquid-crystalline thermoplastic resin layer and that of the liquid-crystalline resin layer, respectively, with satisfying $T_{N0} < T_{L0}$ before heat treatment of the laminated film, in which $T_{N0}$ and $T_{L0}$ indicate the thermal deformation temperature of the non-liquid-crystalline thermoplastic resin layer and that of the liquid-crystalline resin layer, respectively, include polyamides, polyimides, polyamidimides, polyphenylene sulfides, polyether-ether ketones, polyether-sulfones, polysulfones, and their copolymers and blends. For these, especially preferred are polyphenylene sulfides containing sulfur in the molecule, as they are crosslinked through heat treatment to thereby have improved heat resistance and an elevated thermal deformation temperature. Any ordinary crosslinking promoter such as peroxide agents and metal thiophosphinates, or crosslinking inhibitor such as dialkyl tin-dicarboxylates and aminotriazoles may be added to the non-liquid-crystalline thermoplastic resins.

In the invention, the thermal deformation temperature of each resin layer is measured through thermal mechanical analysis (TMA) and is read on a temperature (° C.) vs dimensional change (%) curve of the resin layer analyzed. Concretely, the resin layer to be analyzed is heated at a heating rate of 20° C./min, with a predetermined tensile load per the unit cross-sectional area of the layer being applied thereto. On the thermal deformation curve of the resin layer, the point at which the line tangential to the curve at a temperature just before rapid thermal deformation and the line tangential thereto at a temperature after the thermal deformation cross, is the thermal deformation temperature of the resin layer.

The liquid-crystalline resin laminated film of the invention is a laminated film comprising a liquid-crystalline resin layer and a non-liquid-crystalline thermoplastic resin layer. The liquid-crystalline resin layer is of a liquid-crystalline resin or a liquid-crystalline resin-containing polymeralloy; and the non-liquid-crystalline thermoplastic resin layer is of a non-liquid crystalline thermoplastic resin. The interlayer adhesiveness between the liquid-crystalline resin layer and the non-liquid-crystalline thermoplastic resin layer must be at least 30 N/cm, preferably at least 35 N/cm. If the interlayer adhesiveness therebetween is smaller than 30 N/cm, it is unfavorable since the two layers will easily peel apart while the laminated film is handled or processed in secondary working.

The non-liquid-crystalline thermoplastic resin layer to be laminated on the liquid-crystalline resin layer is of a resin such as those mentioned hereinabove, and its porosity is at most 10%. The resin layer having a porosity of substantially less than 1% is non-porous.

The porosity is measured by taking a photographic picture of the surface of the liquid-crystalline resin laminated film through a scanning electronic microscope (SEM), marking the pores in the SEM picture on an OHP sheet, and analyzing the image with an image analyzer (IA).

The liquid-crystalline resin laminated film having such good interlayer adhesiveness can be obtained by co-extruding a liquid-crystalline resin and a non-liquid-crystalline thermoplastic resin such as those mentioned hereinabove, and laminating them in melt. The liquid-crystalline resin laminated film of the invention can have such good interlayer adhesiveness when the two layers are laminated both in melt. If only one layer is in melt, or that is, if either the liquid-crystalline resin layer only or the non-liquid-crystalline thermoplastic resin layer only is in melt when the two layers are laminated, the interlayer adhesiveness between the laminated two layers falls between 5 and 10 N/cm and is small, and if so, the two layers will peel apart. Accordingly, in order to obtain the good interlayer adhesiveness as in the invention, the two resin layers must be laminated both in melt.

Liquid-crystalline resin rapidly crystallizes. Therefore, if it is extruded alone and its melt layer is rapidly cooled in air, the surface of the resulting film is fibrillated. As a result, the surface of ordinary liquid-crystal films is poorly adhesive and is poorly resistant to abrasion. However, in the method of producing the liquid-crystalline resin laminated film of the invention, a liquid-crystalline resin and a non-liquid-crystalline thermoplastic resin are co-extruded and laminated. In this, therefore, the surface of the liquid-crystalline resin layer is not cooled so rapidly and is therefore prevented from being fibrillated, and, as a result, the surface adhesiveness of the laminated film is enhanced.

Co-extrusion followed by melt lamination of the two resins improves the interlayer adhesiveness between the liquid-crystalline resin layer and the non-liquid-crystalline thermoplastic resin layer; and the presence of the non-liquid-crystalline resin layer on the liquid-crystalline resin layer compensates for one drawback, poor adhesiveness of the liquid-crystalline resin. Specifically, a non-liquid-crystalline thermoplastic resin is laminated on at least one surface, but preferably on both surfaces of a liquid-crystalline resin layer to give a liquid-crystalline resin laminated film having good adhesiveness. In order that the laminated film well satisfies the requirements with the melt flow of the liquid-crystalline resin being unified everywhere in its production, the thickness of the liquid-crystalline resin layer preferably falls between 50 and 95% of the overall thickness of the laminated film.

Also preferably, the surface toughness, Ry, of the non-liquid-crystalline thermoplastic resin layer is at most 3 μm for good surface smoothness of the laminated film. Ry is the maximum height of surface roughness of films, defined in JIS B0601.

Melt lamination of the liquid-crystalline resin and the non-liquid-crystalline thermoplastic resin may be effected in any known method. For this, for example, employed is a method of laminating them in an extrusion die; or a method of using a lamination adapter for laminating them before an extrusion die. Especially preferred is the method of using a lamination adapter. In the extrusion die for the method, the distance between the manifold and the lip may be at least 3 cm, but preferably at least 5 cm, most preferably at least 10 cm. For this, more preferred is a coathanger-type extrusion die that enables uniform extrusion in the transverse direction.

When $T_{N0}<T_{L0}$, the laminated film thus obtained is heated to satisfy $T_{N1} \geq T_{L1}$. Preferably, $T_N$ and $T_{N1}$ are higher than $T_L$ and $T_{L1}$, respectively, by at least 3° C., more preferably at least 5° C., most preferably at least 10° C.

The method for heat treatment is not specifically defined. For example, the laminated film may be heated in hot air, or may be exposed to radiation heat, or may be heated by hot rolls. The temperature for the heat treatment shall be lower than the melting point of the non-liquid-crystalline thermoplastic resin layer of the laminated film. Preferably, the temperature for heat treatment is gradually elevated for further improving the heat resistance of the heated laminated film. By controlling the time for heat treatment, the thermal deformation temperature of the resin layer can be controlled at a predetermined point. If the temperature for heat treatment is higher than the melting point of the laminated film, it is unfavorable since the laminated film could hardly keep its shape while it is heated.

The thus-obtained, liquid-crystalline resin laminated film is stretched in the machine direction and/or in the transverse direction to thereby cancel the anisotropy in characteristics or to make the film have specific anisotropy. To cancel the anisotropy in characteristics, the laminated film is preferably stretched in the transverse direction since the liquid-crystalline resin therein is readily oriented in the flow direction. For ordinary thermoplastic resin, the stretching temperature may be not lower than the glass transition point temperature (Tg) of the resin at which the resin begins to soften. In the present invention, however, it is desirable that the laminated film is stretched at a temperature at which the non-liquid-crystalline thermoplastic resin therein softens but does not substantially melt and at which the liquid-crystalline resin therein softens or melts. In the laminated film to be stretched under the condition, the thermal deformation temperature, measured through thermal mechanical analysis (TMA), of the non-liquid-crystalline thermoplastic resin must be not lower than that of the liquid-crystalline resin therein. In this, if the thermal deformation temperature of the non-liquid-crystalline thermoplastic resin is lower than that of the liquid-crystalline resin, or that is, if the non-liquid-crystalline thermoplastic resin melts earlier than the liquid-crystalline resin, it could not be a support for the liquid-crystalline resin and, as a result, the laminated film could not be well stretched.

Accordingly, when the laminated film of the invention is stretched at a temperature at which the non-liquid-crystalline thermoplastic resin therein softens but does not substantially melts and at which the liquid-crystalline resin therein softens or melts, it can be uniformly stretched. The mode of stretching the laminated film is not specifically defined. However, for stretching the laminated film while it is in melt, preferred is a mode of biaxial stretching as it enables high-temperature stretching. Concretely, the laminated film may be stretched between two rolls that rotate at different spherical speeds, or may be stretched by the use of a tenter in which the distance between the clips that hold the film is varied.

For driving the film-holding clips of the tenter, employable is a screw system, a pantograph system or a linear motor driving system. Preferred is a linear motor driving system, as enabling good control in stretching the film.

In case where the temperature condition in stretching the laminated film in the machine direction and/or in the transverse direction is varied, the film is first stretched in the machine direction in a radiation heat system in which the film is not kept in contact with the heat source, and then stretched in the transverse direction in a hot air system. The heat source for the radiation heat system may be a heat-radiating heater. In this, it is desirable that the laminated film is, while heated, stretched between two rolls that rotate at different spherical speeds. Regarding the film path in the system, preferred is a mode of vertically running the film from the lower roll to the upper roll to stretch it, or a mode of vertically running the film from the upper roll to the lower roll to stretch it.

The thus-obtained, liquid-crystalline resin laminated film of the invention may be used for circuit boards, for which a conductor pattern is formed on at least one surface of the laminated film. In particular, the laminated film is favorable for interposers on which IC chips are mounted. The laminated film is usable in IC chip packages, in which IC chips are mounted on an interposer of the laminated film.

Hereinunder described is one example of liquid-crystalline polyester/polyamide, which is for more concretely demonstrating the method for producing the liquid-crystalline resin laminated film of the invention.

For the liquid-crystalline polyester resin, prepared are Siveras (from Toray), Vectra (from Polyplastic), Rodrun (from Unitika), and Sumikasuper (from Sumitomo Chemical). If desired, an inorganic or organic compound such as silicon oxide, magnesium oxide, calcium carbonate, titanium oxide, aluminium oxide, crosslinked polyester, crosslinked polystyrene, mica, talc, kaolin; a hydrolysis inhibitor, a heat stabilizer and an antioxidant are added to the resin. For polyamide of which the thermal deformation temperature is not lower than that of the liquid-crystal line resin, prepared are Amodel (from Teijin), Arlen (from Mitsui Chemical) and PA9T(from Kuraray). These resins hydrolyze when heated in the presence of water. Therefore, before melt extrusion, they are dried and dewatered.

The dry materials are combined to satisfy $T_N \geq T_L$, and each material is fed into a melt extruder such as a single-screw extruder, a double-screw extruder, a vented extruder or a tandem extruder, and melt-extruded from it in a nitrogen atmosphere or in vacuum so that the molecular weight, for example, the intrinsic viscosity [η] of the material is prevented as much as possible from lowering. To remove the impurities from the materials, it is desirable that the resin melt is extruded, while optionally filtered through a filter of, for example, sintered metal, porous ceramic, sand or screen filter.

The thus-extruded resin melts are laminated through a three-layer lamination adapter to have a structure of polyamide layer/liquid-crystalline polyester layer/polyamide layer, and then cast through a T-dye to be a film on a cooling member such as a drum, according to a known casting method of, for example, an electrostatic casting method, an air chamber method, an air knife method or a press roll method, and the film thus cast on the cooling member is then cooled and solidified thereon.

The thus-obtained, cast film is optionally stretched. For stretching it, employable is any method of MD mono-axial stretching, TD mono-axial stretching, successive bi-axial stretching or simultaneous bi-axial stretching. The stretching temperature is not lower than the melting point of the liquid-crystalline resin. At the stretching temperature, the non-liquid-crystalline thermoplastic resin softens but does not substantially melt and the liquid-crystalline resin softens or melts. For liquid-crystalline polyester resin, the stretching temperature generally falls between 220 and 350° C. The draw ratio may be from 2 to 8 times, but preferably from 2 to 4 times in one direction. After having been thus stretched, the film may be optionally heatset.

The thus-obtained, liquid-crystalline resin laminated film has good interlayer adhesiveness and good surface adhesiveness, and, in addition, its surface is smooth and its characteristics are isotropic.

On at least one surface of the thus-obtained, liquid-crystalline resin laminated film, a conductor.pattern may be formed by etching copper leaf deposited thereon (for example, with an aqueous ferric chloride solution), or by thermally transferring the conductor pattern onto the film with a pattern mold pressed against it followed by implanting a conductive paste into the pattern grooves, to thereby fabricate a circuit board. If desired, the circuit boards thus fabricated may be laminated to form a multi-layer circuit board. Further if desired, the multi-layer circuit board may be processed to form through-holes. For forming the through-holes, usable is a drill or a laser, or they may be formed in a melt-penetration method. The interlayer circuits may be connected by plating the through-holes.

The thus-obtained circuit board is favorable for interposers for IC chip packages. IC chips may be mounted on the interposer of the circuit board to be an IC chip package.

Next described is another example of liquid-crystalline polyester/polyphenylene sulfide, which is for more concretely demonstrating the method for producing the liquid-crystalline resin laminated film of the invention.

For the liquid-crystalline polyester resin, prepared are the same as those in the other example mentioned hereinabove. For the non-liquid-crystalline thermoplastic resin that satisfies $T_{N1} \geq T_{L1}$, prepared is a polyphenylene sulfide, Ryton (from Toray). These resins foam when heated in the presence of water. Therefore, before melt extrusion, they are dried and dewatered.

Each dry material is fed into a melt extruder such as a single-screw extruder, a double-screw extruder, a vented extruder or a tandem extruder, and melt-extruded from it in a nitrogen atmosphere or in vacuum so that the molecular weight, for example, the intrinsic viscosity [η] of the material is prevented as much as possible from lowering. To remove the impurities from the materials, it is desirable that the resin melt is extruded, while optionally filtered through a filter of, for example, sintered metal, porous ceramic, sandor screen filter.

The thus-extruded resin melts are laminated through a three-layer lamination adapter to have a structure of polyphenylene sulfide layer/liquid-crystalline polyester layer/polyphenylene sulfide layer, and then cast through a T-dye to be a film on a cooling member such as a drum, according to a known casting method of, for example, an electrostatic casting method, an air chamber method, an air knife method or a press roll method, and the film thus cast on the cooling member is then cooled and solidified thereon.

The thus-obtained, cast film is in a condition of $T_{N0}<T_{L0}$ in this stage. Therefore, it is heated so as to satisfy $T_{N1} \geq T_{L1}$. Regarding the condition for heat treatment, the film is heated in hot air at a temperature lower than the melting point of the polyphenylene sulfide, and the heating temperature is then gradually elevated. After having been thus heated, the film is optionally stretched. For stretching it, employable is any method of MD mono-axial stretching, TD mono-axial stretching, successive bi-axial stretching or simultaneous bi-axial stretching. The stretching temperature is not lower than the melting point of the liquid-crystalline resin. At the stretching temperature, the non-liquid-crystalline thermoplastic resin softens but does not substantially melt and the liquid-crystalline resin softens or melts. For liquid-crystalline polyester resin, the stretching temperature generally falls between 220 and 350° C. The draw ratio may be from 2 to 8 times, but preferably from 2 to 4 times in one direction. After having been thus stretched, the film may be optionally heatset.

The thus-obtained, liquid-crystalline resin laminated film has good interlayer adhesiveness and good surface adhesiveness, and, in addition, its surface is smooth and its characteristics are isotropic.

The thus-obtained, liquid-crystalline resin laminated film may be processed in the same manner as above to form a circuit board. The resulting circuit board is favorable for interposers for IC chip packages. IC chips may be mounted on the interposer of the circuit board to be an IC chip package.

EXAMPLES

The invention is described in more detail with reference to the following Examples and Comparative Examples.

Methods for Measuring Physical Properties

1. Interlayer Adhesiveness:

The interlayer adhesiveness of the laminated film is measured according to ASTM D903-49.

2. Porosity:

Enlarged through a scanning electronic microscope (SEM, S-2110A from Hitachi), the surface of the laminated film is observed, and its 100 fields are photographed. The pores in each of the SEM pictures are marked on an OHP sheet, on which the image is analyzed with an image analyzer (IA). The data of the 100 fields thus analyzed are averaged.

Porosity=(pore area in the film surface in one field)/(overall surface area of the film in one field)×100 (%).

3. Thermal Deformation Temperature:

For thermal mechanical analysis (TMA), used is a thermal analysis station (MTS-9000 from Shinku Riko) with a sample analysis module (TM-9400). The test film (4 mm width×15 mm length) to be analyzed is heated at a heating rate of 20° C./min, with a tensile load of 162 MPa being applied thereto, and the data are plotted on a temperature (° C.) vs dimensional change (%) curve. On the thermal deformation curve, the point at which the line tangential to the curve at a temperature just before rapid thermal deformation and the line tangential thereto at a temperature after the thermal deformation cross, is read, and this is the thermal deformation temperature of the test film.

4. Thickness Variation:

Using a film thickness tester KG601A and an electronic micrometer K306C (both from Anritsu), the thickness of a sample (30 mm width×40 m length) of the film to be analyzed is continuously measured. From the maximum thickness TMAX (μm) and the minimum thickness TMIN (μm) of the film sample both in the machine direction and in the transverse direction, obtained is the thickness fluctuation R, R=TMAX−TMIN. From the average thickness TAVE (μm) and R of the film sample, obtained is the thickness variation thereof, as follows:

Thickness variation (%)=R/TAVE×100.

Films of which the thickness variation is smaller than 10% are good (○); those of which the thickness variation is from 10% to smaller than 15% are average (Δ); and those of which the thickness variation is 15% or more are not good (x).

5. Film Thickness Constitution:

The test film to be analyzed is embedded in paraffin, which is then cut with a microtome in the direction vertical to the film surface. The exposed cross section of the test film is observed with a transmission, light-field optical microscope or a polarization microscope, and the thickness of each layer of the film is measured.

6. Surface Smoothness:

The surface roughness Ry of the test film is measured at room temperature, according to JIS B0601. The measurement length is 2 mm, and the cut-off length is 0.25 mm. The device used for the measurement is a three-dimensional surface roughness meter (from Kosaka Laboratory).

7. Film Surface Adhesiveness:

Aluminium is deposited on the film surface, and the deposited Al layer is cut to form 100 cross-cuts of 1 mm×1 mm. An adhesive tape, Nichiban's Cellophane Tape is attached to the cross-cuts of the deposited Al layer, strongly pressed with fingers, and then rapidly peeled in the 180-degree direction. The number of cross-cuts having remained on the film is counted. Films on which at least 70 cross-cuts remained are good (○); those on which from more than 50 to less than 70 cross-cuts remained are average (Δ); and those on which less than 50 cross-cuts remained are not good (x).

8. Mechanical Properties:

The tensile strength and the elongation of the laminated film are measured according to the methods defined in JIS K7127; and the elastic modulus (Young's modulus) thereof is according to the method in JIS Z1702. Using an Instron-type tensile tester, the laminated film is tested at 25° C. and 65% RH.

Example 1

A Toray's commercial product, Siveras was used for the liquid-crystalline resin (LCP); and a Teijin's commercial product, Amodel, a type of polyphthalamide resin was for the non-liquid-crystalline thermoplastic resin.

The thermal deformation temperature of the liquid-crystalline resin (LCP) and that of the non-liquid-crystalline thermoplastic resin measured through TMA were 270° C. and 285° C., respectively.

The liquid-crystalline resin (LCP) was dried in vacuum at 130° C. for 6 hours; and the non-liquid-crystalline thermoplastic resin was in vacuum at 120° C. for 24 hours.

After having been dried, the starting resins were fed into separate melt extruders both having a cylinder diameter of 90 mm, and the liquid-crystalline resin (LCP) melted at 320° C. and the non-liquid-crystalline thermoplastic resin melted at 340° C. were laminated through a lamination adapter to form a three-layered structure of Amodel/LCP/Amodel, which was then extruded out through a T-die having a lip width of 600 mm to form a film. The melt flow condition was uniform and not uneven in the center part of the T-die and at the edge thereof. The thus-extruded melt film was led via an air knife to a casting drum having a diameter of 1 m. The casting drum was kept at 25° C., on which the cast film was cooled and solidified.

Next, the cast film was fed into a pantograph-type, simultaneous bi-axial stretcher, and, while heated at 270° C., at which LCP melts and the surface layer film softens but does not melt, stretched 2 times in the machine direction and 3.5 times in the transverse direction, and then the laminated film was heat set at 250° C. Through the process, the laminated film of Amodel/LCP/Amodel obtained had a layer thickness of 10 μm/50 μm/10 μm. The interlayer adhesiveness of the laminated film thus obtained was 30 N/cm; and the porosity of the surface layer of Amodel was 0% and was non-porous. The properties of the film are shown in Table 1. The biaxially-stretched liquid-crystalline film had good surface smoothness and good surface adhesiveness.

Example 2

A Polyplastic's commercial product, Vectra A950 was used for the liquid-crystalline resin (LCP); and a GE Plastic's commercial product, Ultem 1000, a type of polyetherimide (PEI) was for the non-liquid-crystalline thermoplastic resin. The thermal deformation temperature of the liquid-crystalline resin (LCP) and that of the non-liquid-crystalline thermoplastic resin measured through TMA were 180° C. and 220° C., respectively.

The liquid-crystalline resin (LCP) and the non-liquid-crystalline thermoplastic resin were dried in vacuum at 150° C. for 4 hours. After having been dried, the starting resins were fed into separate melt extruders both having a cylinder diameter of 90 mm, and the liquid-crystalline resin (LCP) and the non-liquid-crystalline thermoplastic resin both melted at 340° C. were laminated through a lamination adapter to form a three-layered structure of PEI/LCP/PEI, which was then extruded out through a T-die having a lip width of 600 mm to form a film.

The melt flow condition was uniform and not uneven in the center part of the T-die and at the edge thereof. The thus-extruded melt film was led via an air knife to a casting drum having a diameter of 1 m. The casting drum was kept at 25° C., on which the cast film was cooled and solidified.

Next, the cast film was fed into a pantograph-type, simultaneous bi-axial stretcher, and, while heated at 200° C., at which the liquid-crystalline resin (LCP) melts and the non-liquid-crystalline thermoplastic resin softens but does not melt, stretched 2.5 times in the machine direction and 5 times in the transverse direction, and then the laminated film was heat set at 200° C. Through the process, the laminated film of PEI/LCP/PEI obtained had a layer thickness of 5 μm/50 μm/5 μm. The interlayer adhesiveness of the laminated film thus obtained was 32 N/cm; and the porosity of the surface layer of PEI was 0% and was non-porous. The properties of the film are shown in Table 1. The biaxially-stretched liquid-crystalline film had good surface smoothness and good surface adhesiveness.

Example 3

A Toray's commercial product, Siveras was used for the liquid-crystalline resin (LCP); and a Toray's commercial product, Ryton, a type of polyphenylene sulfide (PPS) resin was for the non-liquid-crystalline thermoplastic resin.

The liquid-crystalline resin (LCP) was dried in vacuum at 130° C. for 6 hours; and the non-liquid-crystalline thermoplastic resin was in vacuum at 170° C. for 5 hours.

After having been dried, the starting resins were fed into separate melt extruders both having a cylinder diameter of 90 mm, and the liquid-crystalline resin (LCP) melted at 320° C. and the non-liquid-crystalline thermoplastic resin film melted at 320° C. were laminated through a lamination adapter to form a three-layered structure of PPS/LCP/PPS, which was then extruded out through a T-die having a lip width of 600 mm to form a film. The melt flow condition was uniform and not uneven in the center part of the T-die and at the edge thereof. The thus-extruded melt film was led via an air knife to a casting drum having a diameter of 1 m. The casting drum was kept at 25° C., on which the cast film was cooled and solidified. $T_{L0}$ and $T_{N0}$ of the cast film were 270° C. and 90° C., respectively.

Next, the cast film was heated at 270° C. for 2 hours and then at 280° C. for 2 hours. After the heat treatment, $T_{L1}$ and $T_{N1}$ of the cast film were 273° C. and 285° C., respectively. The heat-treated film was fed into a high-temperature stretcher, and, while heated at 280° C. at which LCP melts and the surface layer film softens but does not melt, stretched 2 times in the machine direction and 3.5 times in the transverse direction, and then the laminated film was heat set at 250° C. Through the process, the laminated film of PPS/LCP/PPS obtained had a layer thickness of 10 μm/50 μm/10 μm. The interlayer adhesiveness of the laminated film thus obtained was 31 N/cm; and the porosity of the surface layer of PPS was 0% and was non-porous. The properties of the film are shown in Table 1. The biaxially-stretched liquid-crystalline film had good surface smoothness and good surface adhesiveness.

Example 4

A heat-treated laminated film of PPS/LCP/PPS was produced in the same manner as in Example 3, except that the extruded film was heated at 280° C. for 4 hours. After the heat treatment, $T_{L1}$ and $T_{N1}$ of the film were 271° C. and 280° C., respectively.

The heat-treated film was fed into a high-temperature stretcher, and, while heated at 275° C. at which LCP melts and the surface layer film softens but does not melt, stretched 2 times in the machine direction and 3.5 times in the transverse direction, and then the laminated film was heat set at 250° C. Through the process, the laminated film of PPS/LCP/PPS obtained had a layer thickness of 10 μm/50 μm/10 μm. The interlayer adhesiveness of the laminated film thus obtained was 31 N/cm; and the porosity of the surface layer of PPS was 0% and was non-porous. The properties of the film are shown in Table 1. The biaxially-stretched liquid-crystalline film had good surface smoothness and good surface adhesiveness.

laminated film. $T_{L0}$ and $T_{N0}$ of the laminated film were 275° C. and 90° C., respectively.

Next, in the same manner as in Example 3, the laminated film was heated to be a heat-treated laminated film of PPS/LCP/PPS. After the heat treatment, $T_{L1}$ and $T_{N1}$ of the film were 276° C. and 280° C., respectively.

The heat-treated film was fed into a high-temperature stretcher, and, while heated at 278° C. at which LCP melts and the surface layer film softens but does not melt, stretched in the same manner as in Example 3. However, since the interlayer adhesiveness between LCP and PPS therein was low, the stretched film was uneven and its thickness variation was big. The interlayer adhesiveness of the laminated film was 5 N/cm, and it was easy to peel the layers constituting the film. The porosity of the surface layer PPS was 0% and was non-porous. The properties of the laminated film are shown in Table 2. The layers constituting the laminated film easily peeled.

Comparative Example 2

A cast film was produced in the same manner as in Example 1, except that a polyethylene terephthalate resin of which the thermal deformation temperature measured through TMA is 80° C. was used for the non-liquid-crystalline thermoplastic resin, and that the resin was extruded at 300° C. The melt flow condition was not good at the edge of the T-die, and the film width varied. Next, stretching the film at 260° C. was tried but in vain, since the PET film melted. The LCP film did not melt at the temperature, and the film tore in the machine direction. Accordingly, the properties of the cast film are shown in Table 2. The interlayer adhesiveness of the cast film was 30 N/cm.

Comparative Example 3

Polyplastic's Vectra A950 was used for the liquid-crystalline resin (LCP), and formed into a single-layered LCP film.

Concretely, the liquid-crystalline resin (LCP) was dried in vacuum at 150° C. for 4 hours. After having been dried, this was fed into a known melt extruder having a cylinder

TABLE 1

| | Interlayer Adhesiveness (N/cm) | Porosity (%) | Thickness Variation MD/TD | Thickness of Liquid Crystal Layer/Overall Thickness of Laminated Film (μm) | Surface Roughness Ry (μm) | Film Surface Adhesiveness | Tensile Strength (MPa) MD/TD | Tensile Elongation (%) | Elastic Modulus (GPa) |
|---|---|---|---|---|---|---|---|---|---|
| Example 1 | 30 | 0 | o/o | 50/70 | 0.4 | o | 210/220 | 15/13 | 7.0/7.2 |
| Example 2 | 32 | 0 | o/o | 50/60 | 0.6 | o | 230/250 | 12/10 | 7.5/8.0 |
| Example 3 | 31 | 0 | o/o | 50/70 | 0.5 | o | 220/230 | 12/11 | 7.0/8.0 |
| Example 4 | 31 | 0 | o/o | 50/70 | 0.8 | o | 220/230 | 13/12 | 6.9/7.1 |

Comparative Example 1

A Sumitomo Chemical's commercial product, Sumikasuper E6000 was used for the liquid-crystalline resin (LCP), and formed into a single-layered LCP film. Concretely, the liquid-crystalline resin (LCP) was dried in vacuum at 130° C. for 6 hours. After having been dried, this was fed into a melt extruder having a cylinder diameter of 90 mm, melted at 350° C., and extruded out through a T-die having a lip width of 600 mm to form a cast film. Next, using a roll laminator, a non-stretched non-porous PPS film was laminated on both surfaces of the cast film at 250° C. to form a diameter of 90 mm, melted at 320° C., and extruded out through a T-die having a lip width of 600 mm to form a film. The melt flow condition was unstable at the edge of the T-die, and the extruded film had many streaks in the flow direction. The thus-extruded melt film was led to a casting drum having a diameter of 1 m, on which it was cooled and solidified. To the casting drum with the film thereon, applied was a voltage of 10 KV with a wire electrode, and the surface of the drum was kept at 25° C.

Stretching the thus-obtained cast film was tried in the same manner as in Example 2, but in vain, as the film tore in the machine direction. Accordingly, the properties of the cast film are shown in Table 2.

Comparative Example 4

An extrusion film prepared in the same manner as in Example 3 was, without being subjected to heat treatment, fed into a high-temperature stretcher, in which stretching the film was tried at 280° C. in the same manner as in Example 3, but in vain. Of the film, the non-liquid-crystalline thermoplastic resin layer melted and the liquid-crystalline resin layer could not be stretched. Accordingly, the properties of the cast film are shown in Table 2.

Comparative Example 5

A laminated film was prepared in the same manner as in Comparative Example 1, except that a PTFE (polytetrafluoroethylene) film having a porosity of 80% was laminated on both surfaces of the cast film. This was fed into a pantograph-type, simultaneous biaxial stretcher, and, while heated at 278° C. at which the liquid-crystalline resin (LCP) melts and the non-liquid-crystalline thermoplastic resin softens but does not melt, stretched 2.5 times in the machine direction and 5 times in the transverse direction, and then the laminated film was heat set at 200° C. Through the process, the laminated film of PTFE/LCP/PTFE obtained had a layer thickness of 5 μm/50 μm/5 μm. The interlayer adhesiveness of the laminated film thus obtained was 15 N/cm; and the porosity of the surface layer of PTFE was 80% and was porous. The properties of the laminated film are shown in Table 2. The surface adhesiveness of the laminated film was not good (x); and the surface smoothness thereof was also not good as the surface layer of PTFE was porous. For circuit boards, a conductor pattern was difficult to form on the film.

Industrial Applicability

The liquid-crystalline resin laminated film obtained in the manner as above can be processed according to the method mentioned above to form a circuit board. The thus-obtained circuit board is favorable for interposers for IC chip packages. IC chips may be mounted on the interposer of the circuit board to be an IC chip package.

What is claimed is:

1. A liquid-crystalline resin laminated film comprising a liquid-crystalline resin layer and a non-liquid-crystalline thermoplastic resin layer laminated on at least one surface of the liquid-crystalline resin layer, which is characterized in that its interlayer adhesiveness is at least 30 N/cm and which is further characterized in that it satisfies $T_N \geq T_L$ wherein $T_N$ and $T_L$ indicate the thermal deformation temperature of the non-liquid-crystalline thermoplastic resin layer and that of the liquid-crystalline resin layer, respectively, measured through thermal mechanical analysis (TMA).

2. The liquid-crystalline resin laminated film as claimed in claim 1, wherein the porosity of the non-liquid-crystalline thermoplastic resin layer is at most 10%.

3. The liquid-crystalline resin laminated film as claimed in claim 1, wherein the non-liquid-crystalline thermoplastic resin layer is non-porous.

4. The liquid-crystalline resin laminated film as claimed in claim 1, wherein the non-liquid-crystalline thermoplastic resin that satisfies $T_N \geq T_L$ is at least one selected from polyamides, polyimides, polyamidimides, polyether-imides, polyarylates, polyphenylene sulfides, polyether-ether ketones, polyether sulfones, polysulfones, and their copolymers and blends.

5. The liquid-crystalline resin laminated film as claimed in claim 1 or 4, for which a laminated film of liquid-crystalline resin and non-liquid-crystalline thermoplastic resin that satisfies $T_{N0} < T_{L0}$ wherein $T_{N0}$ and $T_{L0}$ indicate the thermal deformation temperature of the non-liquid-crystalline thermoplastic resin layer and that of the liquid-crystalline resin layer, respectively, measured through thermal mechanical analysis (TMA) is heated to satisfy $T_{N1} \geq T_{L1}$ wherein $TN1 \geq T_{L1}$ indicate the thermal deformation temperature of the non-liquid-crystalline thermoplastic resin layer and that of the liquid-crystalline resin layer, respectively.

6. The liquid-crystalline resin laminated film as claimed in claim 5, wherein the non-liquid-crystalline thermoplastic resin to satisfy $T_{N1} \geq T_{L1}$ is at least one selected from polyamides, polyimides, polyamidimides, polyphenylene sulfides, polyether-ether ketones, polyether-sulfones, polysulfones, and their copolymers and blends.

7. The liquid-crystalline resin laminated film as claimed in claim 1, wherein the thickness of the liquid-crystalline resin layer falls between 50 and 95% of the overall thickness of the laminated film.

8. The liquid-crystalline resin laminated film as claimed in any of claim 1, wherein the surface roughness Ry of the non-liquid-crystalline thermoplastic resin layer is smaller than 3 μm.

|  | Interlayer Adhesiveness (N/cm) | Porosity (%) | Thickness Variation MD/TD | Thickness of Liquid Crystal Layer/Overall Thickness of Laminated Film (μm) | Surface Roughness Ry (μm) | Film Surface Adhesiveness | Tensile Strength (MPa) MD/TD | Tensile Elongation (%) | Elastic Modulus (GPa) |
|---|---|---|---|---|---|---|---|---|---|
| Comp. Ex. 1 | 5 | 0 | x/x | 50/70 | 0.5 | ○ | 220/230 | 12/11 | 7.0/7.2 |
| Comp. Ex. 2 | 30 | 0 | x/x | 300/400 | 10 | Δ | 190/50 | 30/8 | 7.0/2.1 |
| Comp. Ex. 3 |  |  | x/x | 330/330 | 55 | x | 200/20 | 7/3 | 6.0/1.2 |
| Comp. Ex. 4 | 31 | 0 | ○/○ | 300/420 | 0.8 | ○ | 180/50 | 7/4 | 6.3/1.4 |
| Comp. Ex. 5 | 15 | 80 | Δ/Δ | 50/60 | 8 | x | 210/220 | 13/12 | 7.0/7.0 |

9. A method for producing a liquid-crystalline resin laminated film, which comprises applying a non-liquid-crystalline thermoplastic resin layer on at least one surface of a liquid-crystalline resin layer by co-extrusion, followed by stretching to form a laminated film having an interlayer adhesion of at least 30 N/cm: heating such that $T_N \geq T_L$ wherein $T_N$ and $T_L$ indicate the thermal deformation temperature of the non-liquid-crystalline thermoplastic resin layer and that of the liquid-crystalline resin layer, respectively, measured through thermal mechanical analysis (TMA).

10. A method for producing a liquid-crystalline resin laminated film, which comprises applying a non-liquid-crystalline thermoplastic resin layer on at least one surface of a liquid-crystalline resin layer by co-extrusion, followed by stretching to form a laminated film having an interlayer adhesion of at least 30 N/cm, wherein the film is heated after co-extrusion and before stretching.

11. A method for producing a liquid-crystalline resin laminated film, which comprises applying a non-liquid-crystalline thermoplastic resin layer on at least one surface of a liquid-crystalline resin layer by co-extrusion, followed by stretching to form a laminated film having an interlayer adhesion of at least 30 N/cm, wherein the film is stretched at a temperature at which the liquid-crystalline resin layer melts and the non-liquid-crystalline thermoplastic resin layer softens but does not substantially melt.

12. A circuit board fabricated by forming a conductor pattern on at least one surface of the liquid-crystalline resin laminated film of claim 1.

13. The circuit board as claimed in claim 12, which is for an interposer for IC chip packages.

14. An IC chip package fabricated by mounting IC chips on the interposer of claim 13.

15. A method for producing a liquid-crystalline resin laminated film, which comprises applying a non-liquid-crystalline thermoplastic resin layer on at least one surface of a liquid-crystalline resin layer by co-extrusion, followed by stretching to form a laminated film having an interlayer adhesion of at least 30 N/cm, wherein the film is heated after co-extrusion and before stretching, wherein the film is stretched at a temperature at which the liquid-crystalline resin layer melts and the non-liquid-crystalline thermoplastic resin layer softens but does not substantially melt.

* * * * *

UNITED STATES PATENT AND TRADEMARK OFFICE
CERTIFICATE OF CORRECTION

PATENT NO. : 6,605,324 B1
DATED : August 12, 2003
INVENTOR(S) : Machida et al.

It is certified that error appears in the above-identified patent and that said Letters Patent is hereby corrected as shown below:

Column 14,
Line 20, please insert -- before heated -- after "layer".
Line 22, please change "TN1" to -- $T_{N1}$ --;
Line 24, please insert -- after heated -- after "layer".
Line 55, please change "N/cm:" to -- N/cm; --.

Signed and Sealed this

Eighteenth Day of November, 2003

JAMES E. ROGAN
*Director of the United States Patent and Trademark Office*